United States Patent [19]
Arnett et al.

[11] Patent Number: 5,091,826
[45] Date of Patent: Feb. 25, 1992

[54] PRINTED WIRING BOARD CONNECTOR

[75] Inventors: Jaime R. Arnett, Noblesville; Robert J. O'Connor, Greenfield, both of Ind.

[73] Assignee: AT&T Bell Laboratories, Murray Hill, N.J.

[21] Appl. No.: 500,324

[22] Filed: Mar. 27, 1990

[51] Int. Cl.$^5$ .......................... H01R 9/09; H05K 5/00
[52] U.S. Cl. .................................. 361/408; 361/395; 361/399; 361/413; 361/426; 439/76; 439/404; 174/261
[58] Field of Search .................... 439/55, 76, 78, 403, 439/404; 361/392, 394, 395, 397, 398, 399, 404, 406, 408, 409, 413, 426; 174/261; 379/326, 330, 332, 429

[56] References Cited

U.S. PATENT DOCUMENTS

| | | | |
|---|---|---|---|
| 3,858,961 | 1/1975 | Goodman et al. | 339/176 |
| 4,188,505 | 2/1980 | O'Connor | 179/1 PC |
| 4,316,235 | 2/1982 | Latasiewicz | 361/408 |
| 4,388,672 | 6/1983 | Skill | 361/395 |
| 4,494,813 | 1/1985 | Daley et al. | 339/99 |
| 4,820,192 | 4/1989 | Denkmann et al. | 439/404 |
| 4,906,196 | 3/1990 | Bowman et al. | 439/55 X |
| 4,906,803 | 3/1990 | Albrechta et al. | 361/398 X |

OTHER PUBLICATIONS

"Printed Wiring Board Modular Jack", AT&T Technologies Technical Digest, No. 74, Jul. 1984.

Primary Examiner—Leo P. Picard
Assistant Examiner—Paramita Ghosh
Attorney, Agent, or Firm—Michael A. Morra

[57] ABSTRACT

A printed wiring board connector comprises a rigid, dielectric surface with an opening therein. Mounted on the rigid surface are various components and conductive paths; the components include jumper wires that span the opening and are mechanically attached to the rigid surface on opposite sides of the opening. The jumper wires are electrically connected to the conductive paths. The printed wiring board connector is joined with a base unit which comprises a rigid, dielectric structure having connector housing molded therein that extends through the opening in the printed wiring board and includes wire-receiving slots for supporting the jumper wires. In one assembly, the connector housing includes metallic connectors positioned between a lead frame associated with the base unit and the jumper wires. In another assembly, the connector housing includes pairs of slots for facilitating electrical connections. Insulation-displacement connectors are used for easy attachment to the printed wiring board connector.

14 Claims, 3 Drawing Sheets

PRINTED WIRING BOARD CONNECTOR

TECHNICAL FIELD

This invention relates to printed wiring board connectors and more particularly to the construction of a printed wiring board that facilitates electrical interconnections.

BACKGROUND OF THE INVENTION

Connections between a printed wiring board and external wiring have been the subject of may patents and publications, each seeking to reduce cost and facilitate interconnection. One well-known technique is the use of conductive paths, positioned in an orderly array at the edge of a dielectric surface (printed wiring board), together with an edge connector having multiple leaf-spring contacts which are aligned with the array of conductive paths. Such edge connectors, however, are relatively expensive and bulky, particularly when only a small number of connections need to be made. It is therefore desirable to improve the manner in which connections are made between printed wiring boards and external wiring.

In telecommunication technology, the use of modular plugs and jacks is widespread, so the use of modular jacks that mount onto printed wiring boards is well known. One such modular jack is disclosed in the AT&T Technologies Technical Digest - No. 74, July 1984, at pages 17-18. While such modular jacks are much smaller than edge connectors, their interaction with the printed wiring board is fixed for each particular printed wiring board layout so that wiring changes are not easily made without mounting screw-down terminals on the printed wiring board or using a different printed wiring board. Indeed, U.S. Pat. No. 4,188,505 discloses a modular jack connector in which connections between incoming telephone wires and a modular jack are made by screw-engaging connectors, screws, and washers. While this technique has received wide acceptance, improvements in both cost and ease of connection are desirable.

Insulation-displacement connectors have become an important new technique for facilitating the interconnection of wires. U.S. Pat. No. 4,820,192 discloses a connecting block construction in which insulation-displacement connectors are used to facilitate the connection between incoming telephone wires and a modular jack. This is a particularly advantageous device insofar as reliability, flexibility, cost and assembly are concerned. Unfortunately, connecting blocks only provide a convenient structure where electrical equipment can be interconnected. It is desirable to provide an arrangement that readily combines the signal processing capability of printed wiring boards with the ease of connection provided by insulation-displacement connectors.

SUMMARY OF THE INVENTION

A printed wiring board connector comprises a dielectric surface (printed wiring board) having an opening therein and electrically conductive paths thereon. Jumper wires, connected to the conductive paths, span the opening in the printed wiring board and are mechanically attached to the board on opposite sides of the opening.

In illustrative embodiments of the invention, the printed wiring board is combined with various base units which includes a rigid structure that protrudes through the opening in the printed wiring board to facilitate electrical connections with the jumper wire. The rigid structure includes wire-receiving slots for receiving the jumper wires, and connector-receiving slots for receiving metallic, insulation-displacement connectors.

In one illustrative embodiment of the invention, insulation-displacement connectors are contained within the rigid structure; and the base unit further includes a jack frame having a plug-receiving cavity. A plurality of flat, elongated wires are attached to the insulation-displacement connectors at one end, and are positioned within the jack frame at the other end in order to engage the contact wires of a plug inserted into the cavity. So long as the opening in the printed wiring board is sized to accommodate the rigid structure, different printed wiring boards can use the same base unit to thereby provide a number of different processing features at this interface.

In another illustrative embodiment of the invention, the rigid structure merely receives the jumper wires into its wire-receiving slots. These slots do not contain connectors, but are adapted to cooperate with connectors to "sandwich" the jumper wires between itself and the connectors. A modular jack is mounted on the printed wired board in this embodiment rather than on the base unit.

DETAILED DESCRIPTION

Figure 1:
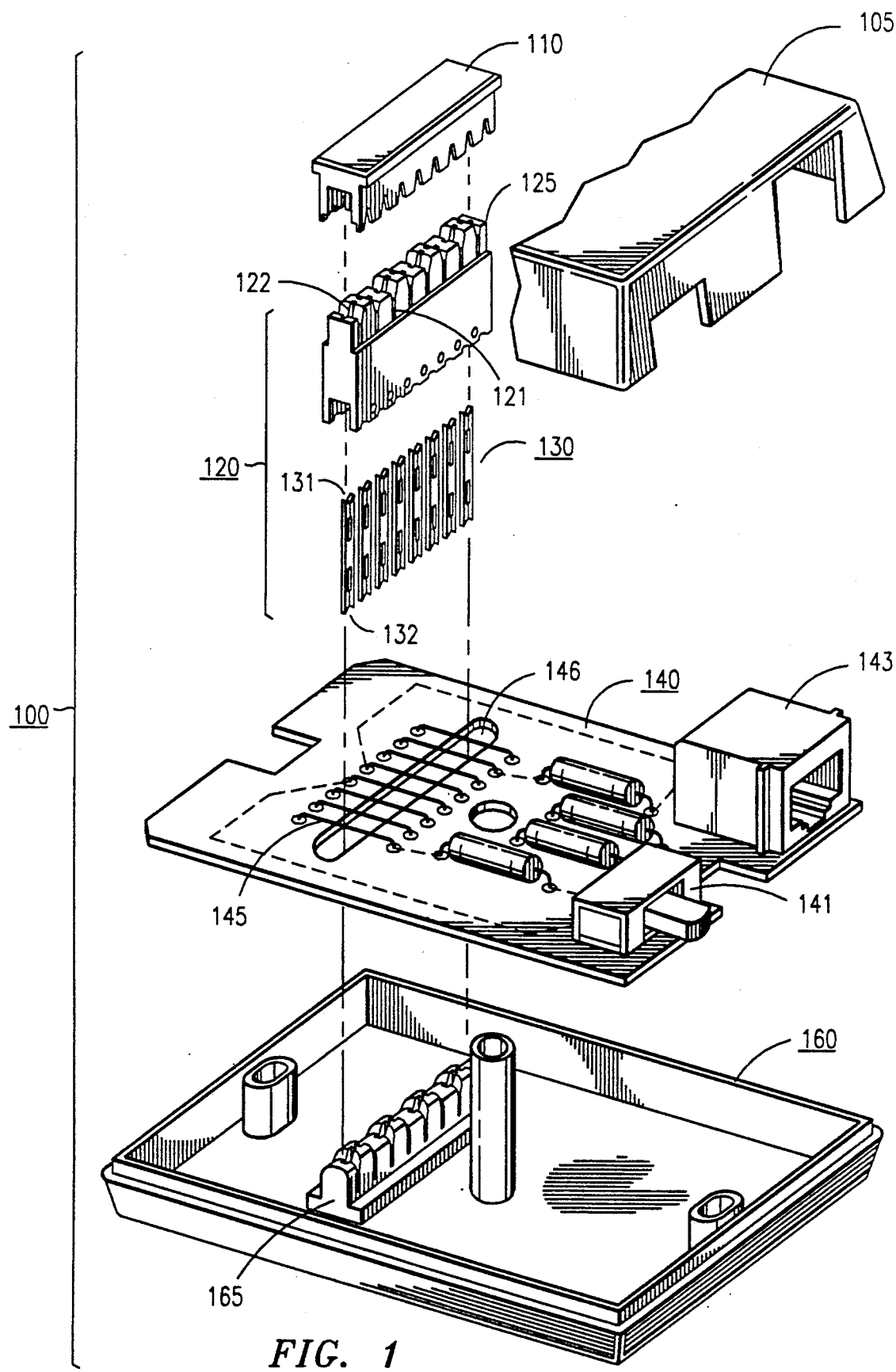
FIG. 1 discloses an embodiment of the printed wiring board connector in accordance with the invention in which the base unit includes a connector-receiving means which does not contain insulation-displacement connectors.

Assembly 100, shown in FIG. 1, discloses an embodiment of the invention suitable for use as a connecting block in a communications application. Assembly 100 is suitable for making connections between a telephone line, for example, and communications equipment. Switch 141 is useful for selecting between options such as levels of amplification or attenuation of the electrical signals passing between the telephone line and the communications equipment. Printed wiring board 140 contains a number of components such as jumper wires 145 and jack 143. There are numerous advantages associated with combining a connecting block, which merely connects communication equipment with one or more wires, and a printed wiring board that includes components (resistors, capacitors, microprocessor, etc.) for processing electrical signals immediately as they enter a facility, before being exposed to stray electrical fields. Opening 146, spanned by jumper wires 145 offers a convenient opportunity to combine the simple functions of a connecting block with the signal processing capability of a printed wiring board.

Assembly 100 includes a base unit 160, a printed wiring board 140, insulation-displacement connector 120, cap 110 and cover 105—each joined to the other forming a surface mounted connecting block having the capability to process signals at a communications interface.

Insulation-displacement connector 120 comprises a molded dielectric housing 125 with eight metallic connectors 130 inserted therein. Metallic connectors 130 are H-shaped, having a pair of opposing insulation-displacement contact fingers at each end thereof. Each metallic connector 130 is positioned within housing 125 so that wires which are pushed into wire-receiving slots 121 will be electrically connected with, and mechanically held by, the top pair of contact fingers 131. The bottom pair of contact fingers 132 electrically connect and mechanically hold the jumper wires 145 that span the opening 146 in the printed wiring board 140. Associated with each of the wire-receiving slots 121 is a pair of connector-receiving slots 122 for receiving the connectors 130. The connector-receiving slots 122 reside in a plane which is perpendicular to the plane of the wire-receiving slots 121. Wires, external to assembly 100 may be connected thereto by insertion into slots 121. Such insertion is aided by placing the wires into the appropriate slots and then joining them to the connectors 130 by pushing down on cap 110. A suitable device for component 120 is the 110-type insulation-displacement connector which is commercially available from AT&T.

Base unit 160 includes a connector-receiving means 165 which is adapted to receive insulation-displacement connector 120. Connector-receiving means 165 has the same structure as the upper half of housing 125, including a plurality of wire-receiving slots that are adapted to receive and support jumper wires 145 as connectors 130 (within insulation-displacement connector 120) move downward to engage the jumper wires. Base unit 160 includes other features molded therein that cooperate with the printed wiring board 140 and the cover 105 to form a unitary structure. The base unit of this example embodiment is molded from thermoplastic materials such as ABS (acrylonitrile butadiene styrene) or PVC (polyvinyl chloride) to provide an inexpensive rigid structure.

In the preferred embodiment, printed wiring board 140 comprises a rigid, dielectric, planar surface such as epoxy glass. Printed wiring board 140 illustratively includes components such as switch 141, jack frame 143 and jumper wires 145 - all interconnected by electrically conductive paths on the surface of the printed wiring board. These components cooperate to process electrical signals that are received and transmitted via the jumper wires and the jack frame. Jack frame 143 is used in making convenient connection to equipment having appropriately sized modular plugs. Specifications for modular plugs and jacks, such as used in connection with the present invention, can be found in Subpart F of the FCC Part 68.500 Registration Rules. Referring once again to the structure of printed wiring board 140, opening 146 is sized to allow connector-receiving means 165, on base unit 160, to fit through it. Furthermore, jumper wires 145 that span opening 146 are positioned to fit into the vertical wire-receiving slots molded into the connector-receiving means 165. Jumper wires 145, in this illustrative embodiment, are 22 AWG plated, solid copper wire, although the use of stranded wires and other metals are possible. Advantageously, wires 145 are machine inserted into printed wiring board 140 so that any desired connectorization pattern is readily achieved. The jumper wires 145 are mechanically attached to the printed wiring board 140 on opposite sides of the opening 146 by insertion into holes that are punched or drilled into the printed wiring board and the application of solder.

Figure 2:
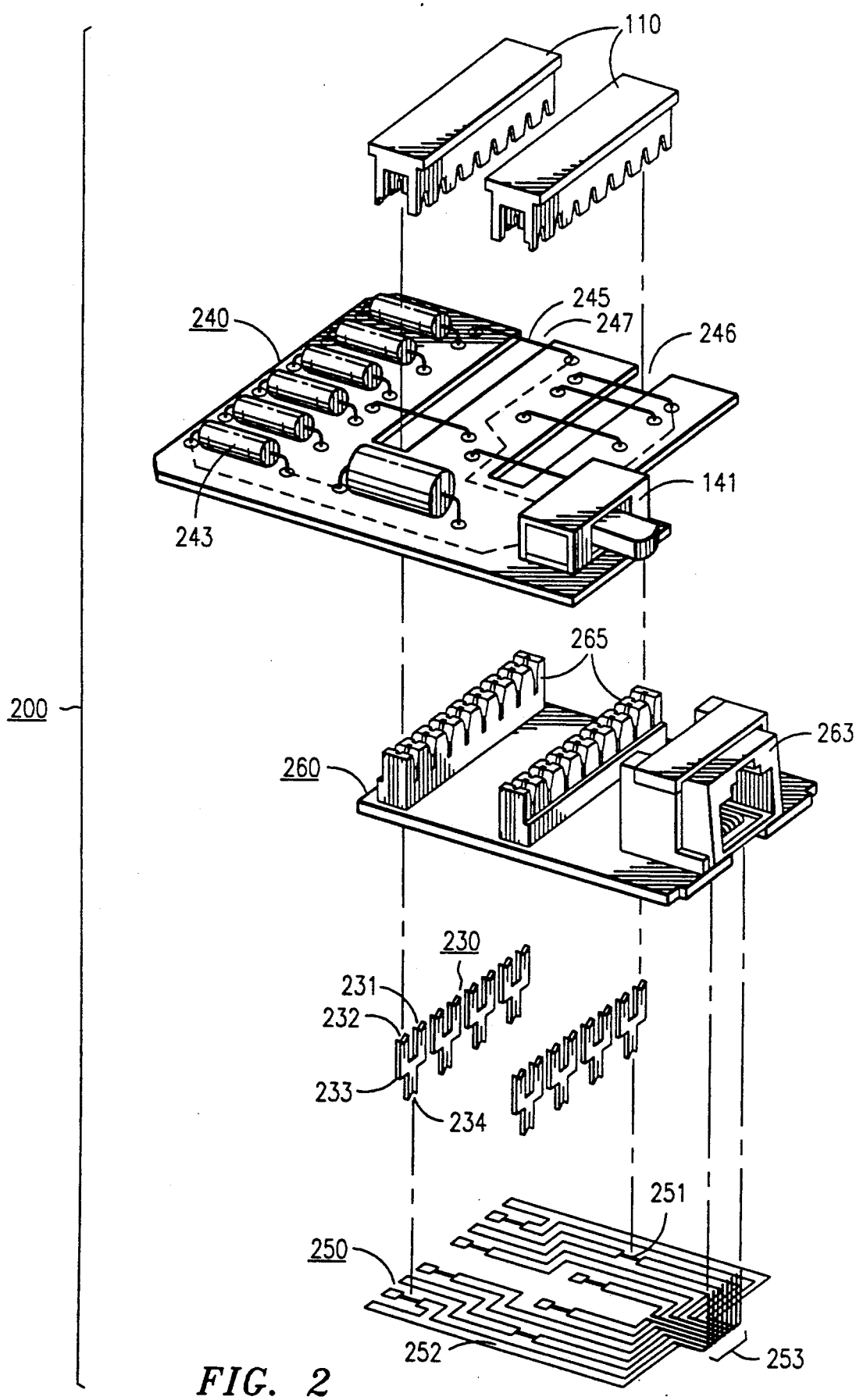
FIG. 2 discloses a second embodiment of the invention in which the base unit includes a connector-receiving means having insulation-displacement connectors contained therein.

Assembly 200, shown in FIG. 2, discloses a second embodiment of the invention which incorporates the connecting block shown in U.S. Pat. No. 4,820,192. Similar to base unit 160 shown in FIG. 1, base unit 260 of FIG. 2 is molded from thermoplastic materials. Connector-receiving means 265 includes apertures on its bottom side (not shown) for receiving up to eight metallic connectors 230. Base unit 260 further includes jack 263 having an opening therein adapted to receive a conventional modular plug.

After connectors 230 are inserted into the base unit 260, lead frame 250 is attached. Narrow portions 251 of the lead frame electrically engage each of the downwardly extending contact fingers 234 of connectors 230. Metallic connectors 230 each include upwardly extending contact finger-pairs 231, 232 that displace the insulation of wires inserted therein, make electrical connection and mechanically hold the wires in a fixed position - thereby facilitating the interconnection of insulated wires. Connectors 230 are made from stamped metal stock. The slanted portions at the extremities of the contact fingers are coined to assist in cutting through a wire's insulation. The contact finger-pairs 231, 232, 234 share a common region 233 that provides structural stability and electrical interconnection.

Lead frame 250 is an interconnection pattern stamped from 15 mil metal stock that is selectively gold plated in the region of the jack wires 253. It is a single rigid piece-part whose peripheral support members are not shown. It is captured on the bottom side of base unit 260 which includes grooves having the same pattern as the lead frame itself. Lead frame 250 comprises 8 flat elongated conductive elements 252 that individually interconnect one of jack wires 253 with one of connectors 230. Each conductor 252 includes a narrow area 251 for connection with one of connectors 230.

Printed wiring board 240 comprises a rigid dielectric surface having a plurality of jumper wires (collectively designated as component 245) that span a pair of openings 246, 247 in the printed wiring board. Illustratively, components 243 and switch 141 cooperate in the processing of electrical signals present on the printed wiring board. Printed wiring board 240 is joined to the assembled base unit (260, 230, 250); and caps 110 are instrumental in the joining process by urging the jumper wires 245 into electrical and mechanical contact with the connectors 230.

Figure 3:
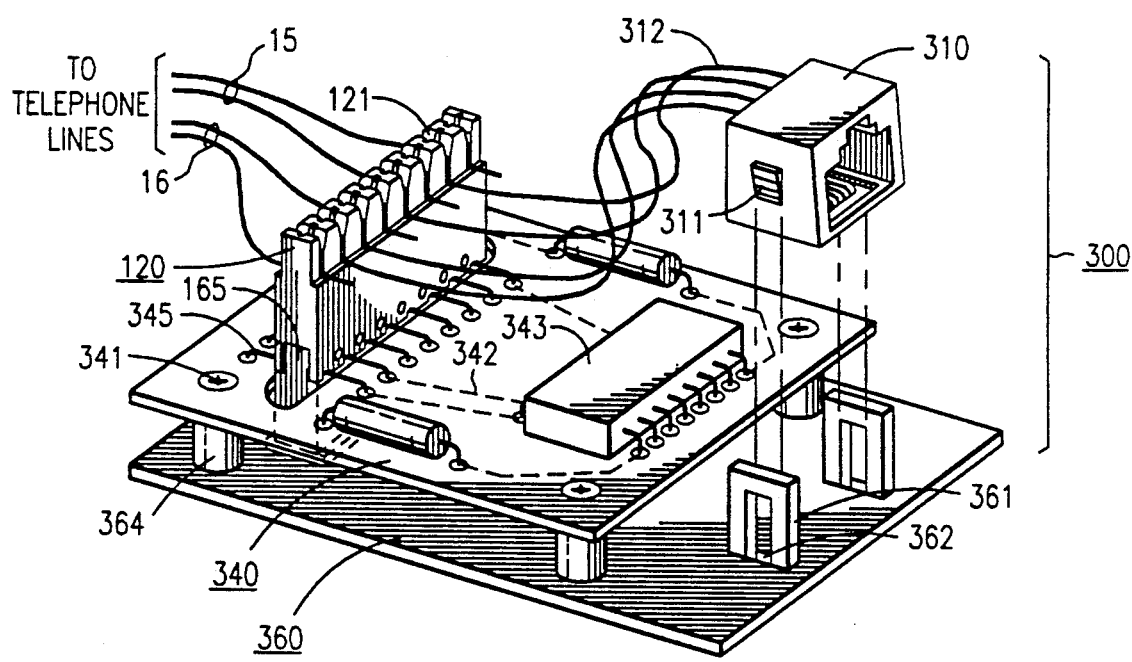
FIG. 3 discloses a third embodiment of the invention which features simple assembly.

Assembly 300, shown in FIG. 3, discloses a third embodiment of the invention. Base unit 360 is a planar surface used to support various components and assemblies. The base unit includes interconnection feature 361,364 that are molded into its structure and used for maintaining structural unity to those components and assemblies that are attached to the base unit 360.

Details molded into base unit 360 include bosses 364, channels 361 and connector-receiving means 165. Cylindrically shaped bosses 364 secure the printed wiring board 340 to the base unit 360 via mounting screws 341. Alternatively, bosses 364 can be replaced by deformable pins that are "heat staked" after insertion into holes located on the printed wiring board; such pins would include a wider region at the base that operates as a stand-off to accommodate component leads that protrude through the printed wiring board. Channels 361 are molded into the base unit 360 and cooperate with tabs 311 on opposite sides of the modular jack 310 to securely hold the modular jack in place. Opening 362 facilitates the molding of channels 361. Connector-receiving means 165 is adapted to receive and hold jumper wires 345 while the insulation-displacement connector 120, discussed in connection with FIG. 1, is pressed onto the jumper wires.

Printed wiring board 340 illustratively contains components such as microprocessor 343 and jumper wires 345 interconnected by conductive paths 342. Microprocessor 343 is capable of providing substantial processing of the electrical signals present at this interface between the telephone lines 15, 16 and/or between communication equipment plugged in to jack 310 and the telephone lines 15, 16. Different printed wiring boards can be accommodated in assembly 300, each providing different features and options in accordance with its particular application. The present invention even allows the same printed wiring board to be used in different applications by connecting all of the jumper wires to the insulation-displacement connector 120; but then only selecting a few predetermined ones to be interconnected with jack wires 312 and telephone wire pairs 15, 16. Typically, only a single wire is inserted into each of the wire-receiving slots 121 for maximum reliability.

The present invention, as illustratively embodied in FIG. 3, provides a flexible and easy to use structure. In the simplest case, printed wiring board 340 merely contains conductive paths 342; although more complex applications include filtering, modulation, multiplexing, level shifting, analog-to-digital conversion and digital-to-analog conversion. Printed wiring board 340 is thus an excellent location for installing equipment in series with a telephone line.

Although various particular embodiments of the invention have been illustrated, various modifications are possible within the spirit and scope of the invention. These modifications include, but are not limited to, use in non-telephone applications, printed wiring boards that are made from flexible mylar rather than rigid epoxy glass, the use of screw-down terminals rather than insulation-displacement connectors to interact with jumper wires that span the opening in the printed wiring board, and the use of stranded jumper wires made from different metals and of different gauges.

We claim:

1. A printed wiring board assembly comprising a printed wiring board and a base unit: the printed wiring board including at least one electrically conductive path thereon and a jumper wire that spans an opening in the printed wiring board, the jumper wired being mechanically attached to the printed wiring board on opposite sides of the opening and connected to the electrically conductive path; the base unit including wire-receiving means that extends through the opening in the printed wiring board, electrical connection with the jumper wire being made within the wire-receiving means.

2. The printed wiring board assembly of claim 1 wherein the printed wiring board and the base unit comprise rigid, dielectric materials.

3. The printed wiring board assembly of claim 1 wherein the wire-receiving means comprises a dielectric block having a plurality of metallic connectors contained therein for electrically connecting with each jumper wire that spans the opening in the printed wiring board.

4. The printed wiring board assembly of claim 3 wherein the base unit further includes a jack frame and a lead frame, the jack frame comprising a dielectric, plug-receiving cavity with wire spring contacts therein, the lead frame comprising a plurality of flat elongated conductive elements that electrically connect with selected ones of metallic connectors to the wire spring contacts of the jack frame.

5. The printed wiring board assembly of claim 4 wherein each metallic connector includes first and second pairs of opposing, insulation-displacement contact fingers; the first pair of contact fingers engaging one of the jumper wires, and the second pair of contact fingers engaging one of the conductive elements of the lead frame.

6. The printed wiring board assembly of claim 1 wherein the wire-receiving means includes means for supporting the jumper wires that span the opening in the printed wiring board, and means for receiving insulation-displacement connectors; whereby the jumper wires are supported within the wire-receiving means as the insulation-displacement connectors move into engagement with the jumper wires.

7. In combination:
  a printed wiring board having a plurality of components mounted thereon, one of the components being a jumper wire that spans an opening in the printed wiring board and is mechanically attached to the printed wiring board; and
  a dielectric base unit for supporting the printed wiring board, said base unit including a structure that protrudes through the opening in the printed wiring board and makes electrical contact with the jumper wire.

8. The combination of claim 7 wherein another of the components mounted on the printed wiring board is a dielectric jack frame having a plug-receiving cavity with wire spring contacts therein, said jumper wire being electrically connected to one of the wire spring contacts of the jack frame by an electrically conductive path on the printed wiring board.

9. The combination of claim 7 wherein the printed wiring board comprises a rigid, dielectric material.

10. The combination of claim 7 wherein the structure includes a plurality of wire-receiving slots for supporting the jumper wires inserted therein, and at least one connector-receiving slot for receiving metallic connectors that make mechanical and electrical contact with said jumper wires.

11. A printed wiring board assembly comprising a printed wiring board and a base unit:
  the printed wiring board including electrically conductive paths on a dielectric surface that connect with two or more jumper wires that extend across an opening in the printed wiring board; and
  the base unit comprising a dielectric structure including a connector-receiving feature that extends through the opening in the printed wiring board, the connector-receiving feature including means for making electrical contact with each of the jumper wires.

12. The printed wiring board assembly of claim 11 further including a dielectric housing containing a plurality of metallic connectors, each metallic connector having first and second pairs of opposing, contact fingers; the first pair of contact fingers for engaging one of the jumper wires, and the second pair of contact fingers for engaging a wire that communicates electrical signals to apparatus external to the printed wiring board.

13. The printed wiring board assembly of claim 12 wherein the base unit further includes a dielectric jack frame having a plug-receiving cavity with wire spring contacts therein, said wire spring contacts being electrically connected to selected one of said second pair of contact fingers.

14. The printed wiring board assembly of claim 13 wherein the base unit further includes interconnection features molded therein for mechanically holding the printed wiring board and the dielectric jack frame so that a unitary structure is achieved.

* * * * *